(12) United States Patent
Bouvier et al.

(10) Patent No.: US 9,124,286 B1
(45) Date of Patent: Sep. 1, 2015

(54) PROTECTION FOR ANALOG TO DIGITAL CONVERTERS

(71) Applicant: INTEGRATED DEVICE TECHNOLOGY, INC., San Jose, CA (US)

(72) Inventors: Stéphane Bouvier, Cairon (FR); Sylvain Dumont, Langrune sur Mer (FR); Luis Rolindez, Caen (FR)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/183,159

(22) Filed: Feb. 18, 2014

(51) Int. Cl.
*H03M 1/10* (2006.01)
*H03M 1/12* (2006.01)
*H03M 1/36* (2006.01)
*H03M 1/46* (2006.01)

(52) U.S. Cl.
CPC ............ *H03M 1/1028* (2013.01); *H03M 1/124* (2013.01); *H03M 1/36* (2013.01); *H03M 1/46* (2013.01)

(58) Field of Classification Search
CPC ....... H03M 1/00; H03M 1/12; H03M 1/1295; H03M 1/34; H03M 2201/11; H03M 1/06; H03M 2201/192; H03M 2201/65
USPC .......... 341/118, 120, 142, 155, 161, 162, 132
See application file for complete search history.

(56) References Cited

U.S. PATENT DOCUMENTS

| | | | | |
|---|---|---|---|---|
| 5,600,527 | A * | 2/1997 | Engel et al. | 361/93.2 |
| 5,659,315 | A * | 8/1997 | Mandl | 341/143 |
| 6,075,478 | A * | 6/2000 | Abe | 341/155 |
| 7,095,346 | B2 * | 8/2006 | Bogner | 341/120 |
| 7,280,065 | B2 * | 10/2007 | Stroble et al. | 341/156 |
| 7,283,083 | B1 * | 10/2007 | Kamal et al. | 341/161 |
| 8,674,863 | B2 * | 3/2014 | Grilo et al. | 341/122 |
| 9,013,340 | B1 * | 4/2015 | Hou et al. | 341/139 |
| 2002/0126034 | A1 * | 9/2002 | Draxelmayr | 341/164 |
| 2011/0006188 | A1 * | 1/2011 | Lin | 250/201.1 |
| 2013/0321190 | A1 * | 12/2013 | Lesso et al. | 341/158 |
| 2014/0132438 | A1 * | 5/2014 | Shen et al. | 341/172 |
| 2014/0240153 | A1 * | 8/2014 | Das | 341/143 |

* cited by examiner

*Primary Examiner* — Linh Nguyen
(74) *Attorney, Agent, or Firm* — Haynes and Boone LLP (57) ABSTRACT

Systems and methods for protecting an analog-to-digital converter (ADC) are provided. The provided systems and methods utilize comparators in a circuit of a stage of the ADC to compare a reference signal to an input signal and output one or more maximum signals when the input signal exceeds the reference signal. A decoder in the stage of the ADC may output a reset signal to another circuit in the stage of the ADC when a predetermined number of the maximum signals are received. When the other circuit receives the reset signal, the ADC may enter a protection mode to protect the ADC by ensuring that the excessive input signal is not propagated to subsequent stages.

19 Claims, 9 Drawing Sheets

PROTECTION FOR ANALOG TO DIGITAL CONVERTERS

BACKGROUND

1. Technical Field

Embodiments disclosed herein are related to protecting an analog-to-digital converter from excessive signals.

2. Related Art

Analog-to-digital converters (ADCs) are important in modern electronics, as they may be used to convert a continuous physical quantity represented by an analog signal to a digital representation that may approximate the amplitude of the analog signal. ADCs may typically convert the analog signal by periodically sampling and quantizing the analog signal to produce a sequence of digital values that correspond to a discrete-time and discrete-amplitude digital signal. One type of ADC is a pipeline or pipelined ADC, which uses multiple steps of conversion in successive stages to produce a digital signal.

Most ADCs may be specified to work within a particular input signal range, referred to as the full scale range, and a system having an ADC may include automatic gain control (AGC) to control the input signal to be within this range. Since the sensitivity of the ADC may be closely related to the signal-to-noise ratio (SNR), the AGC may be typically set so that the input signal is very close to the full scale range of the ADC to improve the SNR. However, when the input signal increases suddenly, such as may occur when a system including the ADC is first powered on, the AGC is typically not fast enough to control the input signal such that the ADC receives an input signal that exceeds the full scale range. For applications where the ADC is used to convert an input voltage, receiving an input signal that is an input voltage that exceeds the full scale range can cause problems.

For example, when the input signal, which may be an input voltage, exceeds the full scale range, the internal voltages of the ADC may exceed the limits permitted by the manufacturing process and may cause transistors of the ADC to experience a hot carrier effect, which may damage and eventually destroy the transistors of the ADC. For most modern submicron manufacturing processes, this is particularly problematic because robustness and protection is sacrificed for increased speed. Moreover, for pipeline or pipelined ADCs, the high input voltage may be propagated to subsequent stages, and can damage more than just the first or initial stage. As another example, when an ADC recovers from a saturation state, calibration information used to calibrate the ADC during the saturation state is skewed such that the ADC is improperly calibrated after the recovery as long as the skewed calibration information determined during the saturation state are propagated. For pipeline or pipelined ADCs, errors due to skewed calibration information may be further propagated to other stages of the ADC, resulting in further errors.

Conventional ADCs may use an external input clamping buffer to limit or "clamp" the input signal to be close to the maximum full scale signal. However, such external clamping buffers have some drawbacks. For example, extra cost and die space is required to add the extra integrated circuit required for the external clamping buffer. The external clamping buffer may also add in additional noise or additional distortion to the input signal, resulting in noise or distortion propagating through the ADC. In addition, because the full scale signal of the ADC will vary based on such factors as temperature and component matching, the external clamping buffer may have to adjust the clamping level, which may lead to a reduced level of the input signal compared to the full scale signal and, consequently, a reduced SNR.

DETAILED DESCRIPTION

In the following description specific details are set forth describing certain embodiments. It will be apparent, however, to one skilled in the art that the disclosed embodiments may be practiced without some or all of these specific details. The specific embodiments presented are meant to be illustrative, but not limiting. One skilled in the art may realize other material that, although not specifically described herein, is within the scope and spirit of this disclosure.

There is a need for an ADC having improved protection from input signals exceeding a full scale signal level that provides improved SNR over the conventional external clamping buffer.

Consistent with some embodiments, there is provided a method for protecting an analog-to-digital converter (ADC). The method includes steps of comparing an input voltage to a reference voltage, outputting at least one maximum signal when the input voltage exceeds the reference voltage, outputting a reset signal when a predetermined number of maximum signals are received, and entering a protection mode when the reset signal is received, wherein the ADC does not output a signal in the protection mode.

Consistent with some embodiments, there is also provided a pipeline analog-to-digital converter. The pipeline analog-to-digital converter includes at least one stage receiving an input voltage and producing outputs of a residue voltage and a digital signal. The at least one stage includes a first circuit receiving the input voltage and producing an output of the digital signal and one or more maximum signal when the input voltage exceeds a reference voltage, a decoder coupled to the first circuit, the decoder configured to output a reset signal when a predetermined number of maximum signals are received, and a second circuit coupled to the decoder and the first circuit, the second circuit receiving the input voltage, the digital signal, and the reset signal when output, and configured to output the residue voltage, wherein the second circuit is configured to not output the residue voltage when the reset signal is output and received.

Embodiments consistent with this disclosure may provide improved protection for ADCs including pipeline ADCs. In particular, embodiments consistent with this disclosure may provide improved protection for ADCs by determining when an signal exceeding a full scale signal level is being received at a first stage of the ADC, and not propagating the excessive signal as well as information corresponding to the excessive signal. Moreover, embodiments consistent with this disclosure may provide protection while continuing to allow ADC to operate at or near a full scale voltage level, thereby providing improved SNR.

Figure 1:
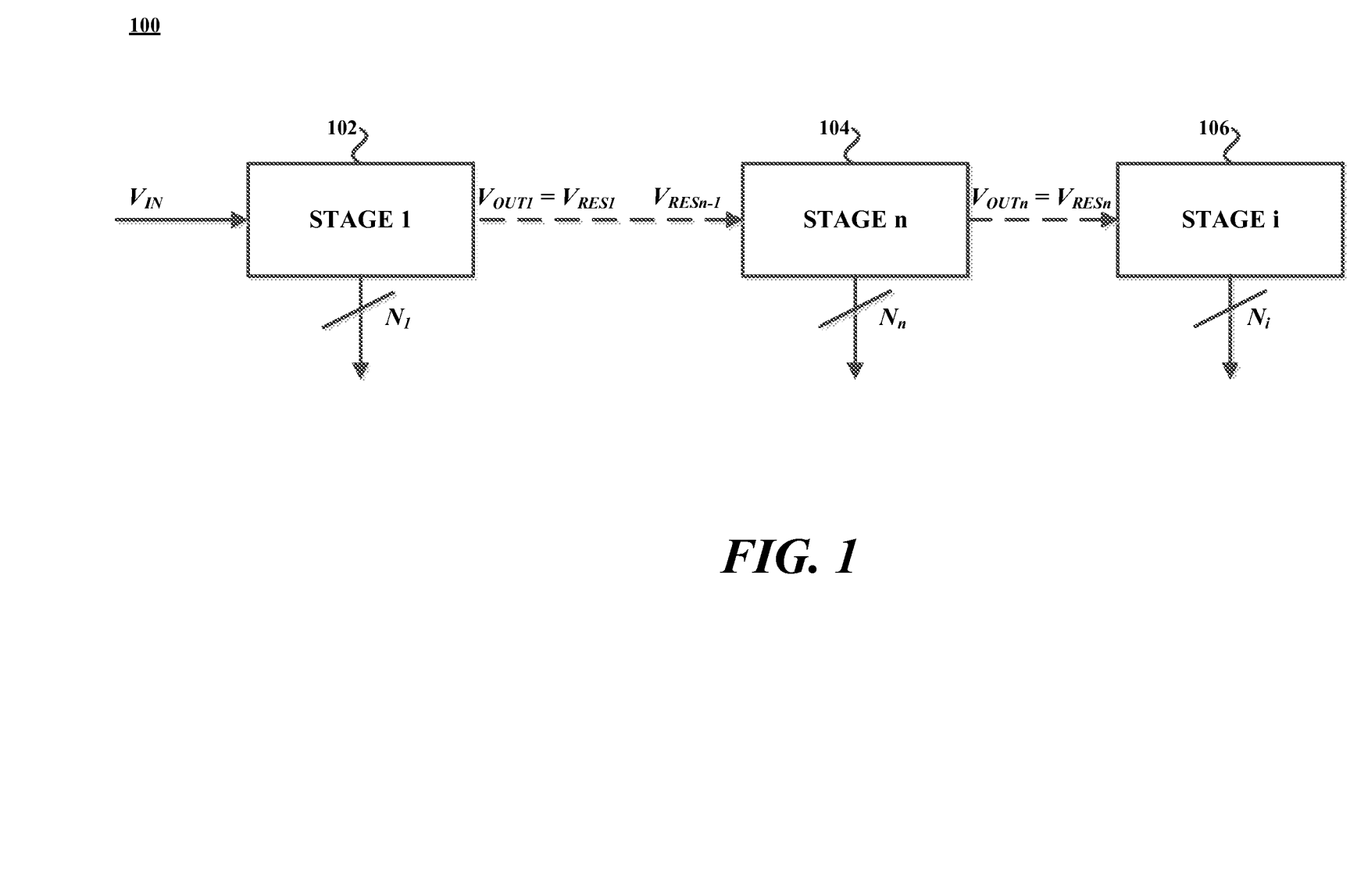
FIG. 1 is a diagram illustrating an ADC, according to some embodiments.

FIG. 1 is a diagram illustrating an ADC 100 according to some embodiments. ADC 100 may include a first stage 102, an nth stage 104, and an ith stage 106, wherein nth stage 104 may be any intermediate stage and ith stage 106 may be the final stage of ADC 100. In some embodiments, ADC 100 may be a pipeline ADC. As shown in FIG. 1, first stage 102 may receive an input voltage $V_{IN}$ and output a digital signal $N_1$ and an output voltage $V_{OUT1}$ which may be a first residue voltage $V_{RES1}$. In some embodiments, digital signal $N_1$ may have a predetermined amount of bits, such as m bits. Intermediate nth stage 104 may receive an input voltage that is a residue voltage from a previous stage, such as $V_{RESn-1}$ and output a digital signal $N_n$ and an output voltage $V_{OUTn}$ which may be an nth residue voltage $V_{RESn}$. Final ith stage 106 may receive an input voltage that is a residue voltage from a previous stage, such as $V_{RESn}$ and output a digital signal $N_i$, which is the final digital signal produced by ADC 100.

Figure 2:
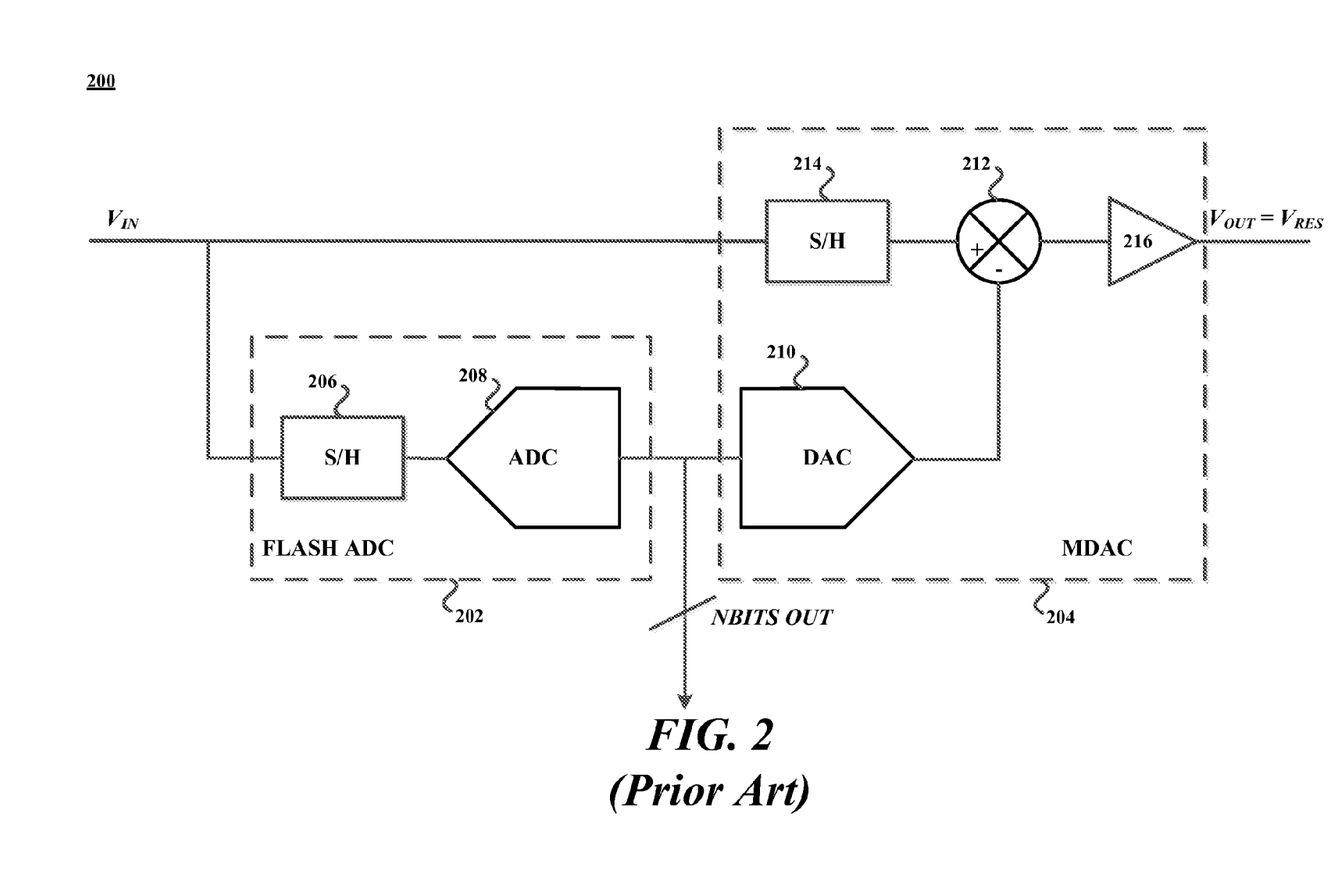
FIG. 2 is a diagram illustrating a conventional stage of a pipeline ADC.

FIG. 2 is a diagram illustrating a conventional stage 200 of ADC 100. Stage 200 may correspond to first stage 102 or intermediate nth stage 104. Stage 200 may also correspond to final ith stage 106 but would not include an output voltage. As shown in FIG. 2, stage 200 may include a flash ADC 202 and a multiplying digital-to-analog converter (MDAC) 204. Flash ADC 202 may measure input voltage $V_{IN}$ to produce an output digital signal NBITS OUT and to configure MDAC 204 to generate a residue voltage $V_{RES}$ that will be propagated to a subsequent stage. Flash ADC 202 may include a sample and hold circuit 206 capable of sampling and holding input voltage $V_{IN}$ and then periodically passing input voltage $V_{IN}$ to an ADC circuit 208. ADC circuit 208 may be capable of converting input voltage $V_{IN}$ into output digital signal NBITS OUT.

MDAC 204 may include a DAC circuit 210 capable of converting output digital signal NBITS OUT to an analog signal which is passed to difference circuit 212. MDAC 204 may also include a sample and hold circuit 214 capable of sampling and holding input voltage $V_{IN}$ and periodically passing input voltage $V_{IN}$ to difference circuit 212. Difference circuit 212 may be capable of determining a difference between voltage input $V_{IN}$ to the analog signal output by DAC circuit 210. The determined difference may then be input into an amplifier 216 which may amplify the difference by a predetermined gain to produce an output voltage $V_{OUT}$ corresponding to residue voltage $V_{RES}$.

Figure 3:
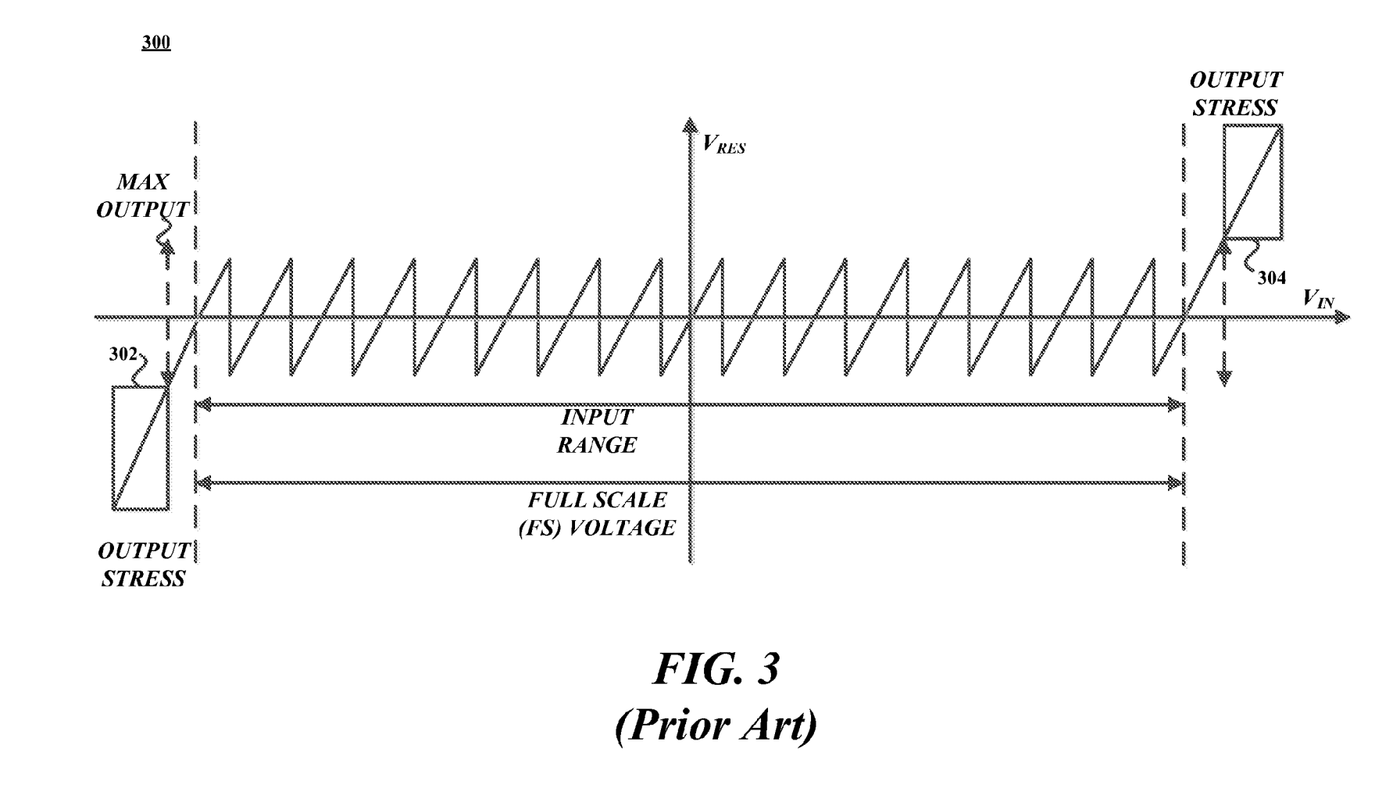
FIG. 3 is a graph illustrating a plot of a residue voltage $V_{RES}$ produced based on a input voltage $V_{IN}$ for a conventional stage of a pipeline ADC.

FIG. 3 is a graph 300 illustrating a plot of residue voltage $V_{RES}$ produced based on input voltage $V_{IN}$ for stage 200 of ADC 100. For the example graph shown in FIG. 3, ADC 100 may be a 4-bit ADC. As shown in FIG. 3, for an input range of input voltage $V_{IN}$ that is within the full scale (FS) voltage range of ADC 100 including stage 200, the produced residue voltage $V_{RES}$ is within a maximum output. However, when input voltage $V_{IN}$ exceeds the full scale voltage range, the produced residue voltage $V_{RES}$ may exceed a maximum output and produce output stresses 302 and 304, which may be propagated to subsequent stages and cause transistors of the circuits in the subsequent stages to experience a hot carrier effect, which may damage and eventually destroy the transistors of the circuits of those stages.

Figure 4:
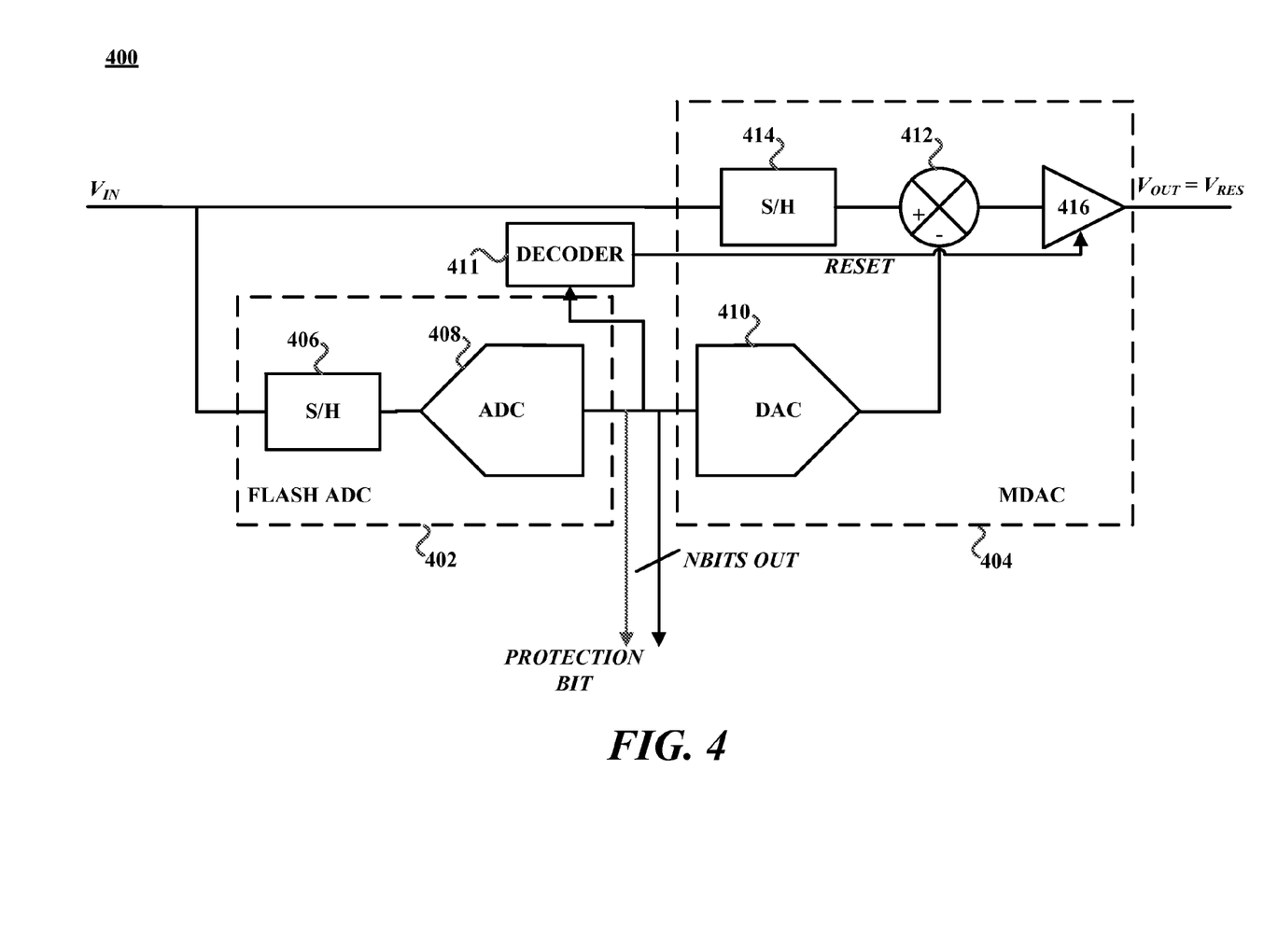
FIG. 4 is a diagram illustrating a stage of an ADC, according to some embodiments.

FIG. 4 is a diagram illustrating a stage 400 of ADC 100, according to some embodiment. In some embodiments, stage 400 may correspond to first stage 102, but in other embodiments, stage 400 may correspond to intermediate nth stage 104 or final ith stage 106. As shown in FIG. 4, stage 400 may include a flash ADC 402 and a multiplying digital-to-analog converter (MDAC) 404. Flash ADC 402 may measure input voltage $V_{IN}$ to produce an output digital signal NBITS OUT and to configure MDAC 404 to generate a residue voltage $V_{RES}$ that will be propagated to a subsequent stage. Flash ADC 402 may include a sample and hold circuit 406 capable of sampling and holding input voltage $V_{IN}$ and then periodically passing input voltage $V_{IN}$ to an ADC circuit 408. ADC circuit 208 may be capable of converting input voltage $V_{IN}$ into output digital signal NBITS OUT that is passed to DAC circuit 410 of MDAC 404 and decoder 411. In some embodiments, decoder 411 may be capable of receiving one or more maximum signals from flash ADC 402 and, when a predetermined number of maximum signals are received from flash ADC 402, produce a reset signal RESET that is sent to MDAC 404. In some embodiments, when reset signal RESET is sent to MDAC 404, flash ADC may also produce a protection bit that may be indicative that ADC is in a protection mode that may be used to inform a user that ADC is in a protection mode. The one or more maximum signals may be digital signals and may be 1-bits signals. The one or more maximum signals may be generated by Flash ADC 402 when input voltage $V_{IN}$ is greater than a predetermined reference voltage, such as a full scale voltage for ADC 100.

MDAC 404 may include a DAC circuit 410 capable of converting output digital signal NBITS OUT to an analog signal which is passed to difference circuit 412. MDAC 404 may also include a sample and hold circuit 414 capable of sampling and holding input voltage $V_{IN}$ and periodically passing input voltage $V_{IN}$ to difference circuit 412. Difference circuit 412 may be capable of determining a difference between voltage input $V_{IN}$ and the analog signal output by DAC circuit 410. The determined difference may then be input into an amplifier 416 which may amplify the difference by a predetermined gain to produce an output voltage $V_{OUT}$ corresponding to residue voltage $V_{RES}$.

Amplifier 416 may also be capable of receiving reset signal RESET from decoder 411 when produced by decoder 411 in response to decoder 411 receiving a predetermined number of maximum signals. In some embodiments, when amplifier 416 receives reset signal RESET may amplifier will not produce output voltage $V_{OUT}$ which may correspond to residue voltage $V_{RES}$. Consequently, when input voltage $V_{IN}$ exceeds a full scale voltage range, flash ADC 402 may generate the predetermined amount of maximum signals which, when received by decoder 411, trigger decoder 411 to produce reset signal RESET and send it to amplifier 416 which will not produce residue voltage $V_{RES}$ and propagate a residue voltage $V_{RES}$ that may exceed a full scale voltage range and potentially damage circuits in subsequent stages. In some embodiments, reset signal RESET may effectively place MDAC in a reset mode, that enables ADC 100 to be in a protection mode or clamping mode. In some embodiments, reset signal RESET may trigger amplifier to amplify a signal input from difference circuit 412 at a gain of zero such that no residue voltage $V_{RES}$ is output from amplifier 416.

Figure 5:
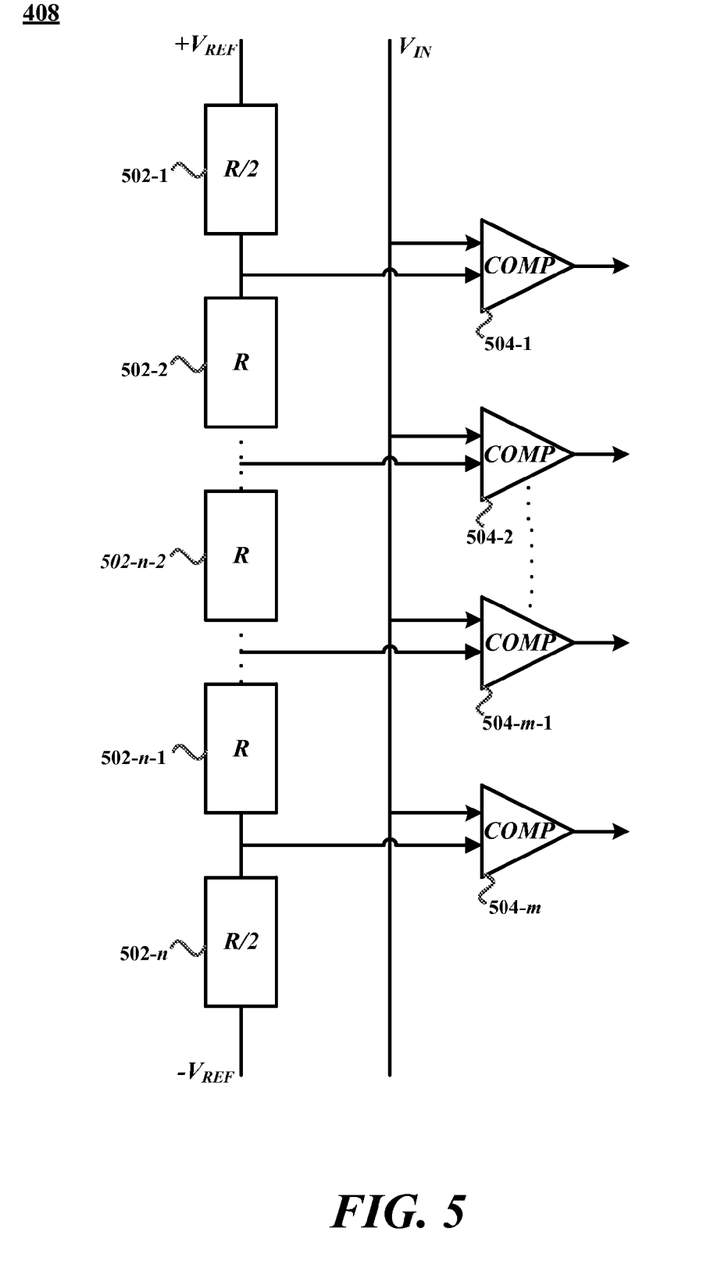
FIG. 5 is a diagram illustrating an ADC circuit of a flash ADC, consistent with some embodiments.

FIG. 5 is a diagram illustrating ADC circuit 408 of flash ADC 402, consistent with some embodiments. As shown in FIG. 5, ADC circuit 408 may include a series of n resistors 502-1-502-n (referred to collectively as resistors 502) having a resistance R or R/2 receiving a positive component of a reference voltage +$V_{REF}$ and a negative component of a reference voltage -$V_{REF}$ from a reference voltage generator (not shown). In some embodiments, a first resistor 502-1 and a last resistor 502-$n$ may have a resistance of R/2. ADC circuit 408 also includes m comparators 504-1-504-$m$ (referred to collectively as comparators 504) capable of receiving a reference voltage, which may be positive component of reference voltage +$V_{REF}$ and negative component of reference voltage -$V_{REF}$ through one or more resistors 502 and receiving input voltage $V_{IN}$. In some embodiments, ADC circuit 408 may have m comparators, wherein m is the number of bits ADC circuit 408 produces based on the received analog signal. In some embodiments, comparators 504 may be capable of comparing the received input voltage $V_{IN}$ to the received reference voltage and outputting a maximum signal when the received input voltage $V_{IN}$ exceeds the received reference voltage. Otherwise, comparators may output digital output signal NBITS OUT. The maximum signal may then be transmitted to decoder 411 which, when a predetermined number of maximum signals are received, will produce reset signal RESET to place ADC 100 in a protection mode. In some embodiments, ADC 100 may still output digital signal NBITS OUT when ADC 100 is in a protection mode as well as one or more bits protection bit indicative that ADC is in a protection mode that may be used to inform a user that ADC is in a protection mode. In some embodiments, first comparator 504-1 and last comparator 504-$m$ may be configured to produce a maximum signal when the received input voltage $V_{IN}$ exceeds a received reference voltage. In such embodiments, decoder 411 may produce reset signal RESET when a maximum signal is received from first comparator 504-1 and last comparator 504-$m$. Consequently, ADC 100 having stage 400 may improve the internal robustness of ADC 100. Further, by not propagating excessive voltages, ADC 100 having stage 400 may be capable of maintaining at or near full scale voltage range of operation during and after an excessive voltage event. In addition, ADC 100 may continue to be calibrated by background calibrations during and after an excessive voltage event because the calibration data will not be skewed by the propagation of the excessive voltage.

Figure 6:
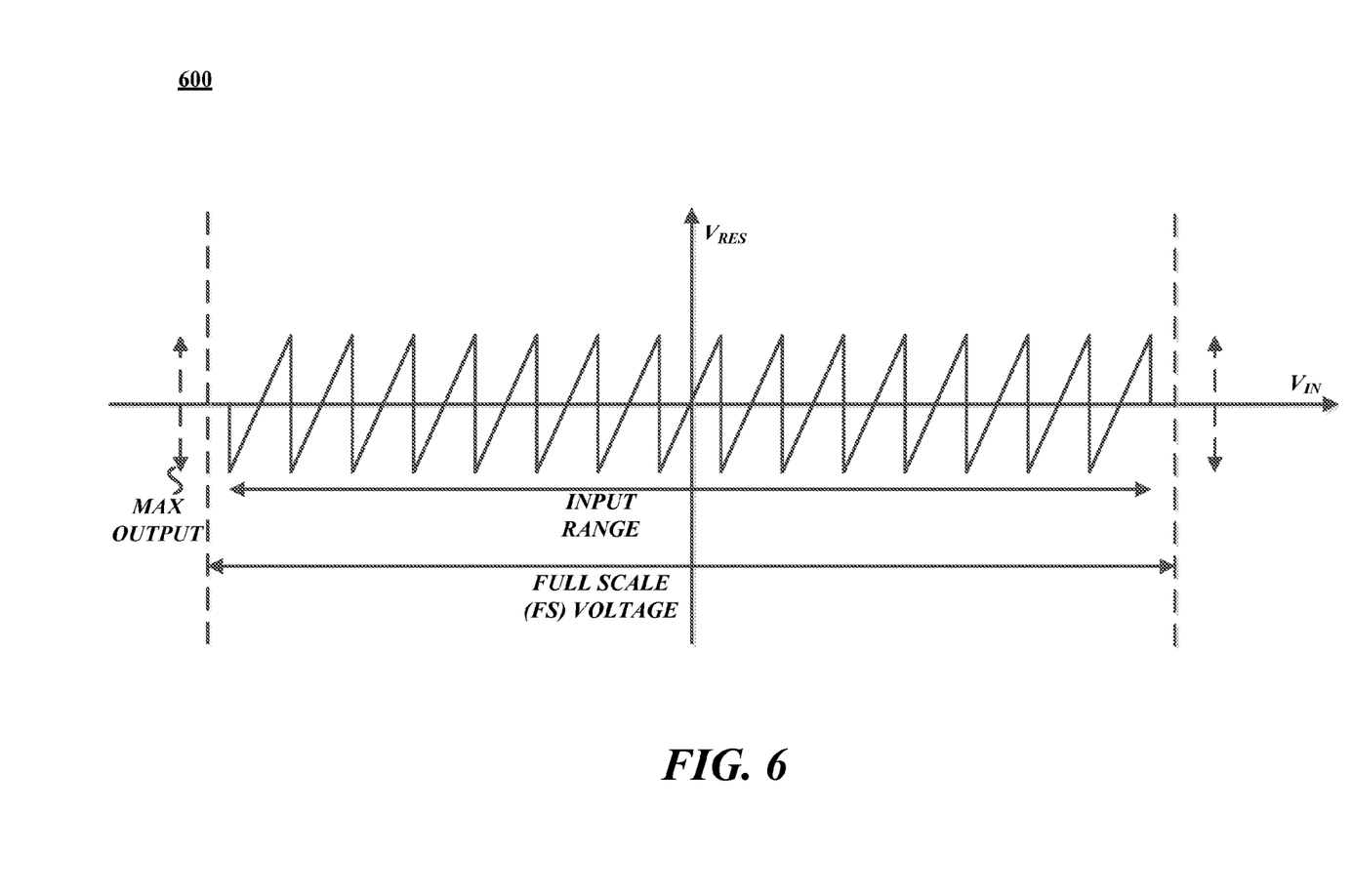
FIG. 6 is a graph illustrating a plot of a residue voltage $V_{RES}$ produced based on input voltage $V_{IN}$ for the stage of an ADC shown in FIG. 4 having the ADC circuit shown in FIG. 5.

FIG. 6 is a graph 600 illustrating a plot of residue voltage $V_{RES}$ produced based on input voltage $V_{IN}$ for stage 400 of ADC 100. For the example graph shown in FIG. 6, ADC 100 may be a 4 bit ADC. As shown in FIG. 6, for an input range of input voltage $V_{IN}$ the produced residue voltage $V_{RES}$ is within a maximum output. However, when input voltage $V_{IN}$ exceeds a full scale voltage, ADC circuit 408 shown in FIG. 5 may produce one or more maximum signals that will be sent to decoder 411 and, if enough maximum signals are received by decoder 411, decoder 411 may produce a reset signal RESET that will be sent to amplifier 416 of DAC 404 to place DAC 404 in a reset mode corresponding to a protection mode for ADC 100 such that a residue voltage $V_{RES}$ is not produced or propagated from stage 400. As shown in FIG. 6, ADC 100 enters a protection mode at the beginning and end of the input range of input voltage $V_{IN}$, such that no residue voltage $V_{RES}$ is produced.

However, as also shown in FIG. 6, when ADC 100 enters a protection mode, the input range of input voltage $V_{IN}$ is effectively reduced from the full scale voltage. The input range of input voltage $V_{IN}$ may be reduced by 20 log $$\frac{2^{Nbits}-1}{2^{Nbits}}.$$

For a 4-bit ADC, the full range of the input range will be $2^4$ (16), such that the full range includes 16 sawtooth patterns, which may be considered to be subranges of the full range. The full range is shown in FIG. 3, which includes 16 subranges. However, as shown in FIG. 6, the input range has been reduced to having only 15 ($2^4$-1) subranges due to the loss of half of a subrange at either end. Consequently, the reduction of the input range for ADC 100 having flash ADC 408 may be 20 log $$\frac{2^4-1}{2^4},$$

which is a reduction of about 0.56 dB from the full scale voltage range. While such a reduction may be fine for most applications, certain applications that require resolution may require the input range of input voltage $V_{IN}$ to be as close to the full scale voltage range as possible.

Figure 7:
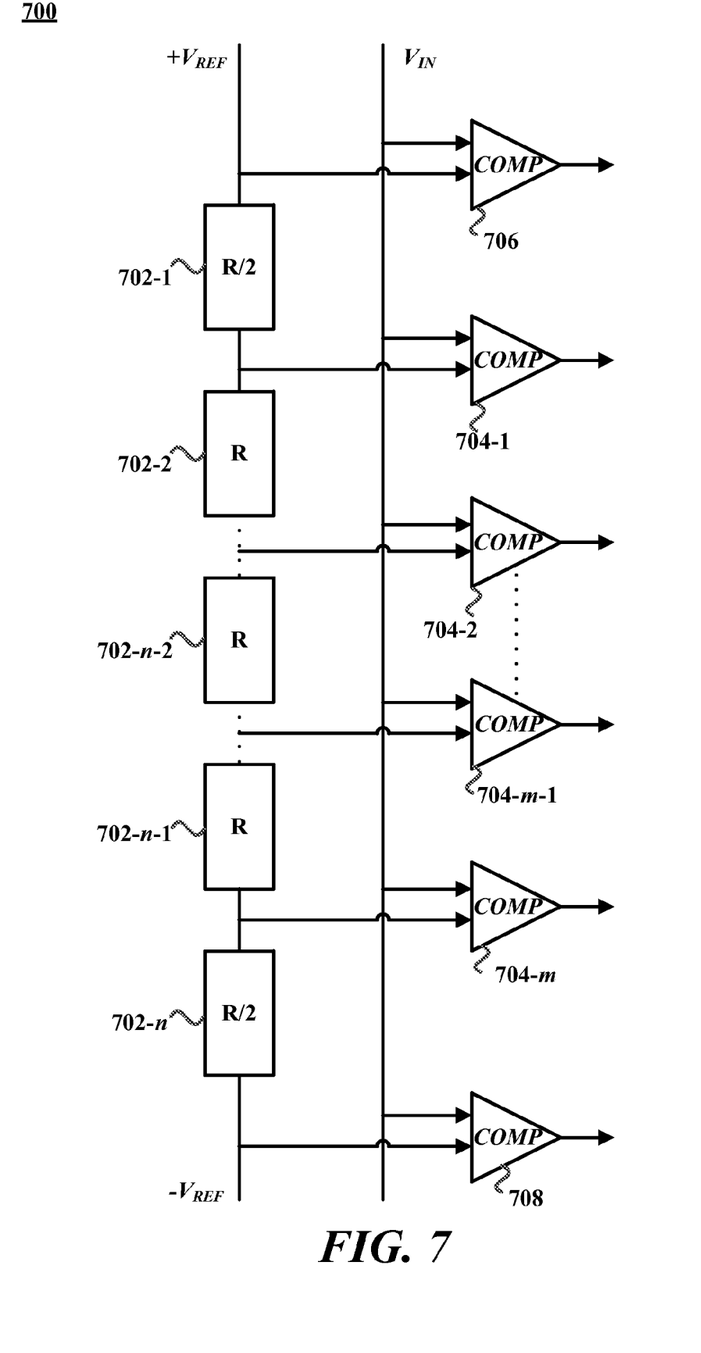
FIG. 7 is a diagram illustrating an ADC circuit of a flash ADC, consistent with some embodiments.

FIG. 7 is a diagram illustrating ADC circuit 700, consistent with some embodiments. ADC circuit 700 may be used in ADC 100 as a replacement for ADC circuit 408. As shown in FIG. 7, ADC circuit 700 may include a series of n resistors 702-1-702-$n$ (referred to collectively as resistors 702) having a resistance R or R/2 receiving a positive component of a reference voltage +$V_{REF}$ and a negative component of a reference voltage -$V_{REF}$. In some embodiments, a first resistor 702-1 and a last resistor 702-$n$ may have a resistance of R/2. ADC circuit 700 also includes m comparators 704-1-704-$m$ (referred to collectively as comparators 704) capable of receiving a reference voltage, which may be positive component of reference voltage +$V_{REF}$ and negative component of reference voltage -$V_{REF}$ through one or more resistors 702 and receiving input voltage $V_{IN}$. ADC circuit 700 may be similar to ADC circuit 408 shown in FIG. 5 except that ADC circuit 700 includes comparators 706 and 708 which respectively receive the positive and negative components of the reference voltage that have not been through resistors 702 as well as input voltage $V_{IN}$.

In some embodiments, comparators 706 and 708 may be capable of comparing the received input voltage $V_{IN}$ to the received reference voltage and outputting a maximum signal when the received input voltage $V_{IN}$ exceeds the received reference voltage. The maximum signal may then be transmitted to decoder 411 which, when maximum signals are received from comparators 706 and 708 are received, will produce reset signal RESET to place ADC 100 in a protection mode. Since the extra two comparators 706 and 708 are not receiving a reference voltage attenuated by a resistance, the reference voltage may be set to the maximum permitted input and full scale voltage range for ADC 100 and provide a better and improved comparison.

Figure 8:
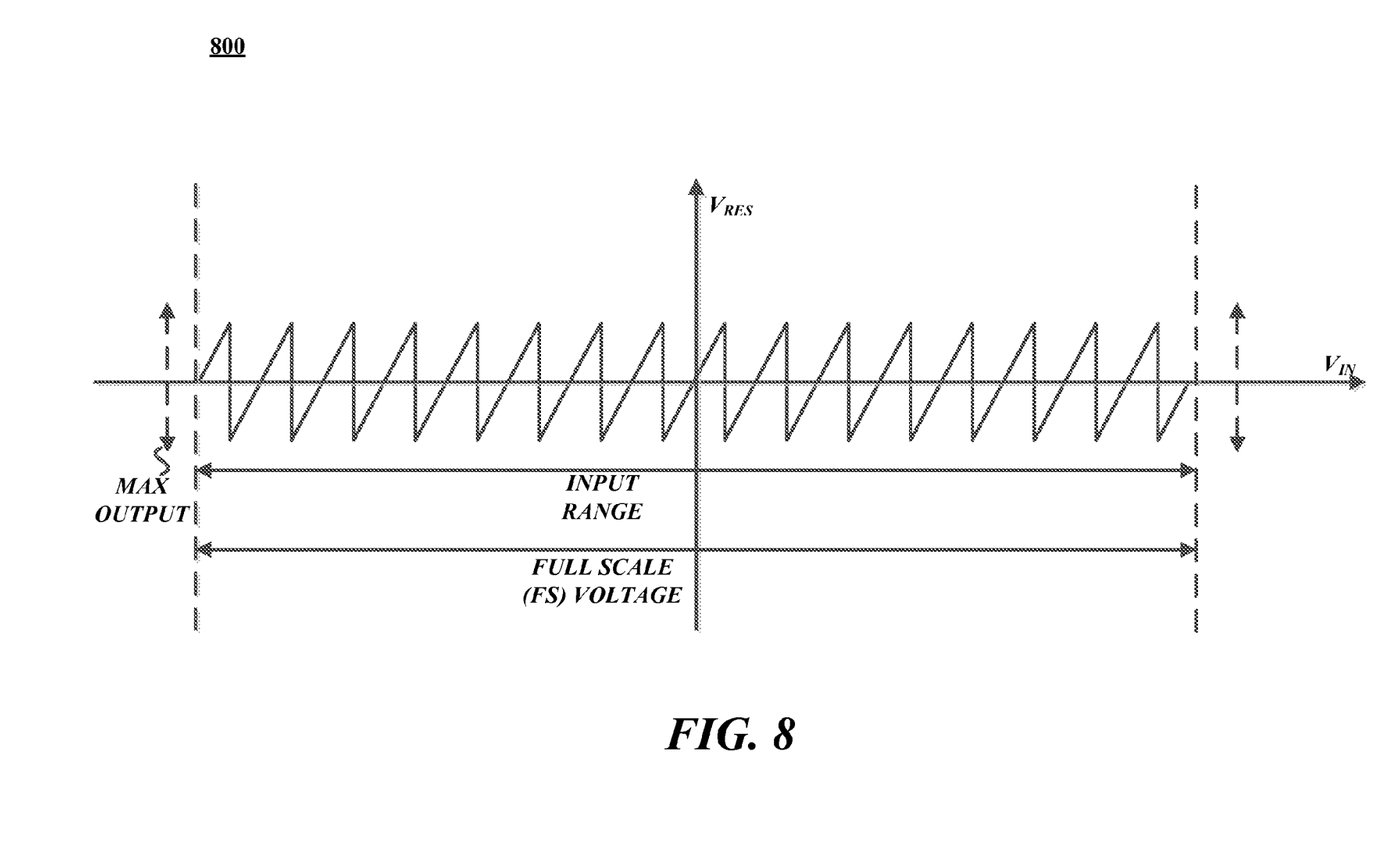
FIG. 8 is a graph illustrating a plot of a residue voltage $V_{RES}$ produced based on input voltage $V_{IN}$ for the stage of an ADC shown in FIG. 4 having the ADC circuit shown in FIG. 7.

FIG. 8 is a graph 800 illustrating a plot of residue voltage $V_{RES}$ produced based on input voltage $V_{IN}$ for stage 400 of ADC 100 having ADC circuit 808 in flash ADC 402. For the example graph shown in FIG. 8, ADC 100 may be a 4 bit ADC. As shown in FIG. 8, for an input range of input voltage $V_{IN}$ the produced residue voltage $V_{RES}$ is within a maximum output. However, when input voltage $V_{IN}$ exceeds a full scale voltage, comparators 706 and 708 of ADC circuit 700 shown in FIG. 7 may produce maximum signals that will be sent to decoder 411 and, when maximum signals are received from comparator 706 and 708 by decoder 411, decoder 411 may produce a reset signal RESET that will be sent to amplifier 416 of DAC 404 to place DAC 404 in a reset mode corresponding to a protection mode for ADC 100 such that a residue voltage $V_{RES}$ is not produced or propagated from stage 400. As shown in FIG. 8, ADC 100 enters a protection mode at the beginning and end of the input range of input voltage $V_{IN}$, such that no residue voltage $V_{RES}$ is produced, and no voltages outside of the maximum permitted input are produced outside of the full scale voltage range. However, as also shown in FIG. 8, by adding extra comparators 706 and 708 to ADC circuit 700 of flash ADC 402, the reference voltage may be set to more closely match, if not exactly match, the full scale voltage permitted by ADC 100 such that ADC 100 may still operate near or at the full scale voltage range.

Figure 9:
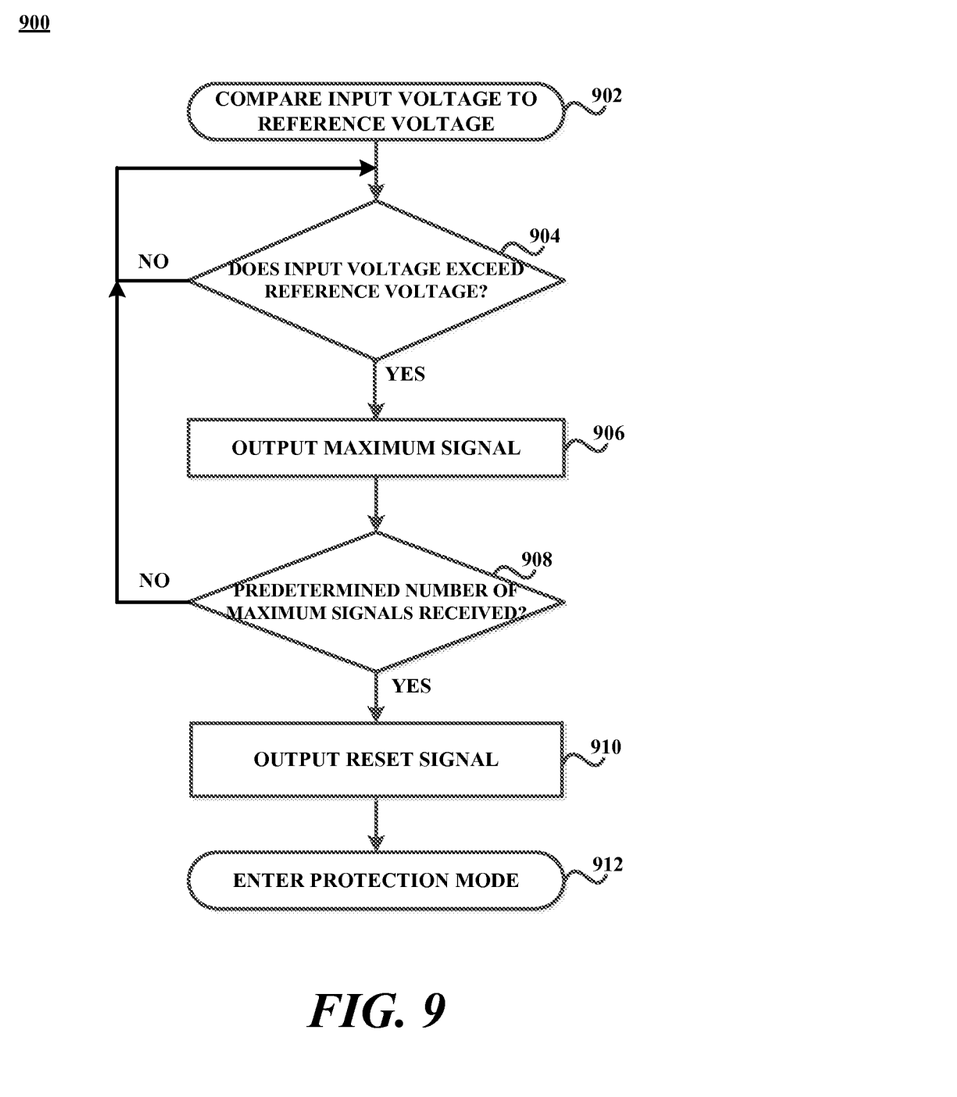
FIG. 9 is a flowchart illustrating a process for protecting an ADC from excessive voltage, consistent with some embodiments.

FIG. 9 is a flowchart illustrating a process 900 for protecting an ADC from excessive voltage, consistent with some embodiments. For the purpose of illustration, process 900 may be described with reference to one or more of FIGS. 1 and 4-8. As shown in FIG. 9, process 900 may include comparing an input voltage to a reference voltage (902). In some embodiments step 902 may be performed by one or more comparators 504 of ADC circuit 408 of ADC 100. In other embodiments, step 902 may be performed by comparators 704-708 of ADC circuit 700 of ADC 100. Moreover, in some embodiments, the input voltage may correspond to $V_{IN}$ and the reference voltage may correspond to the positive component of reference voltage $+V_{REF}$ and the negative component of reference voltage $-V_{REF}$ through one or more resistances R or R/2 such as shown in FIG. 5, or unattenuated such as shown in FIG. 7.

When the input voltage exceeds the reference voltage (904) a maximum signal may be output by comparators 504 or 704-708 (906). When decoder 411 of stage 400 of ADC 100 receives a predetermined number of maximum signals (908), decoder 411 may produce and output a reset signal (910). In some embodiments, the predetermined number of maximum signals may correspond to two maximum signals, and may further correspond to maximum signals received from first comparator 504-1 and last comparator 504-$m$ in ADC circuit 408 or from comparators 706 and 708 in ADC circuit 700. Moreover, the reset signal may be reset signal RESET and may be provided to amplifier 416 of MDAC 404. When MDAC 404 receives the reset signal, ADC 100 may enter a protection mode (912). In some embodiments, entering a protection mode may correspond to amplifier 416 entering a reset mode such that amplifier 416 and, as a result, stage 400 does not produce or propagate a residue voltage $V_{RES}$. Moreover, when amplifier 416 enters a reset mode, a gain of amplifier 416 may be set to zero. When ADC 100 enters a protection mode, stage 400, which may correspond to first stage 102 of ADC, will not propagate an input voltage that may exceed a full scale voltage to prevent the excessive voltage from damaging intermediate ith stage 104 and final nth stage 106. Consequently, ADC 100 performing process 900 may improve the internal robustness of ADC 100. Further, by not propagating excessive voltages, ADC 100 performing process 900 may be capable of maintaining at or near full scale voltage range of operation during and after an excessive voltage event. In addition, ADC 100 may continue to be calibrated by background calibrations during and after an excessive voltage event because the calibration data will not be skewed by the propagation of the excessive voltage.

Embodiments consistent with this disclosure may provide improved protection for ADCs including pipeline ADCs. In particular, embodiments consistent with this disclosure may provide improved protection for ADCs by determining when an signal exceeding a full scale signal level is being received at a first stage of the ADC, and not propagating the excessive signal as well as information corresponding to the excessive signal. Moreover, embodiments consistent with this disclosure may provide protection while continuing to allow ADC to operate at or near a full scale voltage level, thereby providing improved SNR. The examples provided above are exemplary only and are not intended to be limiting. One skilled in the art may readily devise other systems consistent with the disclosed embodiments which are intended to be within the scope of this disclosure. As such, the application is limited only by the following claims.

What is claimed is:

1. A pipeline analog-to-digital converter, comprising:
at least one stage receiving an input voltage and producing outputs of a residue voltage and a digital signal, the at least one stage comprising:
a first circuit receiving the input voltage and producing an output of the digital signal and one or more maximum signal when the input voltage exceeds a reference voltage;
a decoder coupled to the first circuit, the decoder configured to output a reset signal when a predetermined number of maximum signals are received; and
a second circuit coupled to the decoder and the first circuit, the second circuit receiving the input voltage, the digital signal, and the reset signal when output, and configured to output the residue voltage, wherein the second circuit is configured to not output the residue voltage when the reset signal is output and received.

2. The pipeline analog-to-digital converter of claim 1, wherein the first circuit comprises a flash analog-to-digital converter circuit.

3. The pipeline analog-to-digital converter of claim 2, wherein the flash analog-to-digital converter circuit comprises:
a first sample and hold circuit configured to receive the input voltage; and
an analog-to-digital converter circuit configured to receive an output from the first sample and hold circuit and produce the digital signal.

4. The pipeline analog-to-digital converter of claim 3, wherein the analog-to-digital converter circuit comprises a plurality of comparators configured to compare inputs of a reference voltage and the input voltage, the comparators producing the one or more maximum signals when the input voltage exceeds the reference voltage.

5. The pipeline analog-to-digital converter of claim 4, wherein the plurality of comparators comprises a first maximum comparator configured to compare the input voltage to a positive component of the reference voltage and a second maximum comparator configured to compare the input voltage to a negative component of the reference voltage.

6. The pipeline analog-to-digital converter of claim 5, wherein the first maximum comparator is configured to produce a first maximum signal when the input voltage exceeds the positive component of the reference voltage and the second maximum comparator is configured to produce a second maximum signal when the input voltage exceeds the negative component of the reference voltage.

7. The pipeline analog-to-digital converter of claim 6, wherein the decoder is configured to output the reset signal when first maximum signal and the second maximum signal are received.

8. The pipeline analog-to-digital converter of claim 1, wherein the second circuit comprises a multiplying digital-to-analog converter circuit.

9. The pipeline analog-to-digital converter of claim 8, wherein the multiplying digital-to-analog converter circuit comprises:

a second sample and hold circuit configured to receive the input voltage;

a digital-to-analog converter circuit configured to receive the digital signal and output an analog input signal;

a difference circuit configured to determine a difference between the input voltage from the second sample and hold circuit and the analog input signal to output a difference signal; and an amplifier coupled to the difference circuit and the decoder circuit, the amplifier configured to amplify the difference signal by a predetermined gain to produce the residue voltage, wherein the predetermined gain is zero when the reset signal is received.

10. The pipeline analog-to-digital converter of claim 1, wherein the decoder is configured to output the reset signal when two maximum signals are received.

11. A method for protecting an analog-to-digital converter (ADC), comprising:

comparing, by one or more comparators of the ADC, an input voltage to a reference voltage;

outputting, by the one or more comparators, at least one maximum signal when the input voltage exceeds the reference voltage;

outputting, by a decoder coupled to the one or more comparators, a reset signal when a predetermined number of maximum signals are received; and entering, by the ADC, a protection mode when the reset signal is received, wherein the ADC does not output a signal in the protection mode.

12. The method of claim 11, wherein comparing the input voltage to the reference voltage comprises comparing the input voltage to a positive component of the reference voltage and comparing the input voltage to a negative component of the reference voltage.

13. The method of claim 12, wherein outputting the at least one maximum signal comprises outputting a first maximum signal when the input voltage exceeds the positive component of the reference voltage and outputting a second maximum signal when the input voltage exceeds the negative component of the reference voltage.

14. The method of claim 13, wherein outputting the reset signal when at least one maximum signal is received comprises outputting the reset signal when the first maximum signal and the second maximum signal are received.

15. The method of claim 11, wherein entering a protection mode comprises entering, by a multiplying digital-to-analog converter circuit of the ADC, a reset mode when the reset signal is received.

16. The method of claim 15, wherein comparing the input voltage to the reference voltage comprises comparing the input voltage to the reference voltage by one or more comparators of a flash analog-to-digital converter circuit of the ADC.

17. The method of claim 15, wherein entering a protection mode comprises setting a gain of an amplifier of the multiplying digital-to-analog converter circuit of the ADC to zero when the reset signal is received.

18. The method of claim 17, further comprising not producing a residue voltage from the amplifier when the gain is set to zero.

19. The method of claim 18, further comprising not producing the residue voltage from a first stage of the ADC.

\* \* \* \* \*